(12) United States Patent
Cha et al.

(10) Patent No.: US 10,490,660 B2
(45) Date of Patent: Nov. 26, 2019

(54) THIN FILM TRANSISTOR, METHOD OF MANUFACTURING THE SAME, AND DISPLAY APPARATUS INCLUDING THE THIN FILM TRANSISTOR

(71) Applicant: SAMSUNG DISPLAY CO., LTD., Yongin-si, Gyeonggi-do (KR)

(72) Inventors: Gwangmin Cha, Yongin-si (KR); Jungsoo Lee, Yongin-si (KR); Junhong Park, Yongin-si (KR); Hyuneok Shin, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/120,912

(22) Filed: Sep. 4, 2018

(65) Prior Publication Data

US 2019/0074376 A1    Mar. 7, 2019

(51) Int. Cl.
| | |
|---|---|
| *H01L 29/78* | (2006.01) |
| *H01L 21/02* | (2006.01) |
| *H01L 29/786* | (2006.01) |
| *H01L 29/423* | (2006.01) |
| *H01L 29/51* | (2006.01) |
| *H01L 27/12* | (2006.01) |
| *H01L 29/66* | (2006.01) |

(52) U.S. Cl.
CPC .... *H01L 29/7833* (2013.01); *H01L 21/02118* (2013.01); *H01L 21/02126* (2013.01); *H01L 21/02282* (2013.01); *H01L 27/1214* (2013.01); *H01L 29/42384* (2013.01); *H01L 29/51* (2013.01); *H01L 29/6653* (2013.01); *H01L 29/66492* (2013.01); *H01L 29/66742* (2013.01); *H01L 29/786* (2013.01)

(58) Field of Classification Search
None
See application file for complete search history.

(56) References Cited

U.S. PATENT DOCUMENTS 6,576,502 B1 * 6/2003 Kim .................. H01L 29/4908
257/E21.413
2002/0125476 A1    9/2002 Gao et al.

FOREIGN PATENT DOCUMENTS

| JP | 05-082543 A | 4/1993 |
|---|---|---|
| KR | 10-2004-0051373 A | 6/2004 |
| KR | 10-2016-0150085 A | 12/2016 |

* cited by examiner

*Primary Examiner* — Herve-Louis Y Assouman
(74) *Attorney, Agent, or Firm* — Kile Park Reed & Houtteman PLLC

(57) ABSTRACT

A thin film transistor (TFT), a method of manufacturing the TFT, and a display apparatus including the TFT, the TFT including a substrate; a semiconductor layer on the substrate, the semiconductor layer including a channel region, a lightly doped drain (LDD) region, a source region, and a drain region; a gate insulating layer covering the semiconductor layer; a gate electrode overlapping with the channel region such that the gate insulating layer is interposed between the gate electrode and the channel region; and an organic side wall layer on a side surface of the gate electrode, wherein the organic side wall layer includes a silsesquioxane resin.

17 Claims, 7 Drawing Sheets

THIN FILM TRANSISTOR, METHOD OF MANUFACTURING THE SAME, AND DISPLAY APPARATUS INCLUDING THE THIN FILM TRANSISTOR

CROSS-REFERENCE TO RELATED APPLICATION

Korean Patent Application No. 10-2017-0113947, filed on Sep. 6, 2017, in the Korean Intellectual Property Office, and entitled: "Thin Film Transistor, Method of Manufacturing the Same, and Display Apparatus Including the Thin Film Transistor" is incorporated by reference herein in its entirety.

BACKGROUND

1. Field

Embodiments relate to a thin film transistor (TFT), a method of manufacturing the TFT, and a display apparatus including the TFT.

2. Description of the Related Art

A thin film transistor (TFT) is a transistor, in which a semiconductor thin film is arranged on an insulating support substrate, and includes three terminals, e.g., a gate, a drain, and a source. A voltage applied to the gate is adjusted to allow or block a current flowing between the source and the drain in order to perform a switching operation. A TFT is used in various fields such as sensors, memory devices, optical devices, pixel switching devices, driving devices of a display apparatus, etc.

A display apparatus is an apparatus for visually displaying data, and may include a plurality of pixels each including a TFT.

SUMMARY

Embodiments are directed to a thin film transistor (TFT), a method of manufacturing the TFT, and a display apparatus including the TFT.

The embodiments may be realized by providing a thin film transistor, including a substrate; a semiconductor layer on the substrate, the semiconductor layer including a channel region, a lightly doped drain (LDD) region, a source region, and a drain region; a gate insulating layer covering the semiconductor layer; a gate electrode overlapping with the channel region such that the gate insulating layer is interposed between the gate electrode and the channel region; and an organic side wall layer on a side surface of the gate electrode, wherein the organic side wall layer includes a silsesquioxane resin.

The source region and the drain region may include a dopant, and the organic side wall layer may include a material that is the same as the dopant included in the source region and the drain region.

The LDD region may be at opposite sides of the channel region, and the organic side wall layer may overlie the LDD region.

The organic side wall layer may extend to an upper surface of the gate electrode.

A thickness of a portion of the organic side wall layer at the upper surface of the gate electrode may be smaller than a thickness of a portion of the organic side wall layer at the gate insulating layer.

The embodiments may be realized by providing a method of manufacturing a thin film transistor, the method including forming a semiconductor layer on a substrate; forming a gate insulating layer on the substrate to cover the semiconductor layer; forming a gate electrode on the gate insulating layer to partially overlap with the semiconductor layer; injecting a first dopant into the semiconductor layer by using the gate electrode as a mask; forming an organic side wall layer surrounding side surfaces of the gate electrode; and injecting a second dopant into the semiconductor layer by using the gate electrode and the organic side wall layer as a mask, wherein the organic side wall layer includes a silsesquioxane resin.

Forming the organic side wall may include coating the gate electrode with an organic composition, and baking the organic composition.

The organic composition of may include the silsesquioxane resin in an amount of 1.7 wt % to 5 wt %, based on a weight of the organic composition.

An inclination of the organic side wall layer may be adjusted according to a content of the silsesquioxane resin.

A concentration of the first dopant in the semiconductor layer may be lower than a concentration of the second dopant in the semiconductor layer.

The first dopant and the second dopant may be dopants of a same type.

Forming the organic side wall layer may further include forming the layer on an upper surface of the gate electrode.

The method may further include removing the organic side wall layer from the upper surface of the gate electrode.

The embodiments may be realized by providing a display apparatus including a thin film transistor, the display apparatus including a planarization layer covering the thin film transistor; a pixel electrode on the planarization layer, the pixel electrode being connected to the thin film transistor; an opposite electrode facing the pixel electrode; and an intermediate layer between the pixel electrode and the opposite electrode, wherein the thin film transistor includes a semiconductor layer on the substrate, the semiconductor layer including a channel region, a lightly doped drain (LDD) region, a source region, and a drain region; a gate insulating layer covering the semiconductor layer; a gate electrode overlapping with the channel region such that the gate insulating layer is interposed between the gate electrode and the channel region; and an organic side wall layer on a side surface of the gate electrode, wherein the organic side wall layer includes a silsesquioxane resin.

The source region and the drain region may include a dopant, and the organic side wall layer may include a material that is the same as the dopant included in the source region and the drain region.

The LDD region may be at opposite sides of the channel region, and the organic side wall layer may overlie the LDD region.

The organic side wall layer may extend to an upper surface of the gate electrode.

A thickness of a portion of the organic side wall layer at the upper surface of the gate electrode may be smaller than a thickness of a portion of the organic side wall layer at the gate insulating layer.

The display apparatus may further include a pixel-defining layer exposing a center portion of the pixel electrode and covering an edge of the pixel electrode, the pixel defining layer define pixels.

The intermediate layer may include an emission layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
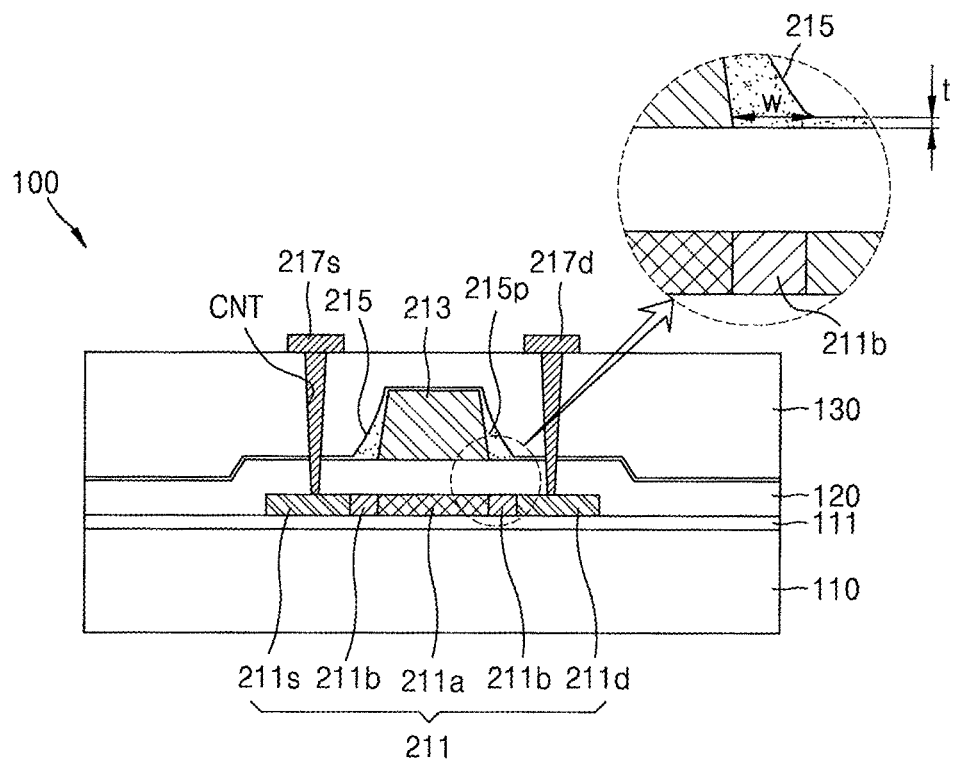
FIG. 1 illustrates a schematic cross-sectional view of a thin film transistor (TFT) according to an embodiment.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The exemplary embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components must not be limited to the above terms. The above terms are used only to distinguish one component from another.

An expression used in the singular encompasses the expression of the plural, unless it has a clearly different meaning in the context.

In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Sizes of components in the drawings may be exaggerated for convenience of explanation. In other words, since sizes and thicknesses of components in the drawings are arbitrarily illustrated for convenience of explanation, the following embodiments are not limited thereto. As used herein, the terms "and/or" and "or" are not exclusive terms, and include any and all combinations of one or more of the associated listed items.

FIG. 1 illustrates a schematic cross-sectional view of a thin film transistor (TFT) 100 according to an embodiment of the present disclosure.

Referring to FIG. 1, the TFT 100 may include, e.g., on a substrate 110, a semiconductor layer 211, a gate insulating layer 120, a gate electrode 213, and an organic side wall layer 215 on a side surface of the gate electrode 213. The thin film transistor 100 may further include, e.g., a buffer layer 111, an interlayer insulating layer 130, a source electrode 217s, and a drain electrode 217d.

The substrate 110 may include various materials, e.g., glass, metal, plastic, etc. In an implementation, the substrate 110 may include a flexible material. Here, the substrate 110 including the flexible material denotes a substrate that is or may be curved, bent, folded, or rolled. The substrate 110 may include various materials having flexible or bendable characteristic, e.g., a polymer resin such as polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide (PI), polycarbonate (PC), or cellulose acetate propionate (CAP).

The buffer layer 111 may be arranged on the substrate 110 to help reduce or block infiltration of impurities, moist, or external air from a lower portion of the substrate 110 and to provide a planarized surface on the substrate 110. The buffer layer 111 may include, e.g., an inorganic material such as oxide or nitride, an organic material, or an organic/inorganic composite material, and may have a single-layered or multi-layered structure of an inorganic material and an organic material. In an implementation, the buffer layer 111 may be omitted.

The semiconductor layer 211 may include, e.g., a channel region 211a, a lightly doped drain (LDD) region 211b, a source region 211s, and a drain region 211d. The semiconductor layer 211 may include a semiconductor material including silicon. In an implementation, the semiconductor layer 211 may include poly-silicon obtained by crystallizing amorphous silicon. In an implementation, the semiconductor layer 211 may include oxide semiconductor or organic semiconductor.

The LDD region 211b may be between the channel region 211a and the source region, and between the channel region 211a and the drain region 211d, and may have a lower carrier concentration than that of the source region 211s and the drain region 211d. For example, the LDD region 211b may be present, and rapid increase in an electric field between the channel region 211a and the source region 211s (or the drain region 211d) may be prevented. Then, an off-current of the TFT 100 may decrease, and a short channel effect that could otherwise occur when a channel length of the TFT 100 decreases may be prevented.

The LDD region 211b may be obtained by doping the semiconductor layer 211 with an n-type or p-type dopant of a low concentration. Here, the low concentration denotes a concentration that is lower than that of the dopant on the source region 211s and the drain region 211d. In an implementation, the dopant on the LDD region may range from, e.g., about $1 \times 10^{12}$ to about $1 \times 10^{13}$ ions/cm$^3$.

A width of the LDD region 211b, e.g., a distance between the channel region 211a and the source region 211s (or the drain region 211d) may be adjusted within a range of, e.g., about 0.4 μm to about 5 μm.

The source region 211s and the drain region 211d may be regions that are electrically conducted by increasing a concentration of carriers. The source region 211s and the drain region 211d may be obtained by doping the semiconductor layer 211 with an n-type or p-type dopant of a high concentration. Here, the high concentration denotes a concentration that is greater than that of the dopant on the LDD region 211b. $1 \times 10^{12}$, the dopant on the source region 211s and the drain region 211d may have a concentration within a range from about $1 \times 10^{14}$ to about $1 \times 10^{15}$ ions/cm$^3$.

doped on the source region 211s and the drain region 211d. In dopant on the source region 211s and the drain region 211d and the dopant on the LDD region 211b may be the same kind as each other. For example, the n-type dopant of low concentration may be doped on the LDD region 211b, and the n-type dopant of high concentration may be doped on the source region 211s and the drain region 211d. In an implementation, the p-type dopant of low concentration may be doped on the LDD region 211b, and the p-type dopant of high concentration may be doped on the source region 211s and the drain region 211d.

The n-type dopant may include, e.g., phosphorus (P), arsenic (As), antimony (Sb), bismuth (Bi), etc. The p-type dopant may include, e.g., boron (B), aluminum (Al), indium (In), gallium (Ga), etc.

The gate insulating layer 120 may be between the semiconductor layer 211 and the gate electrode 213, in order to ensure or provide an insulating property between the semiconductor layer 211 and the gate electrode 213. The gate insulating layer 120 may include, e.g., an inorganic material such as silicon oxide, silicon nitride, and/or silicon oxynitride. The gate insulating layer 120 may be formed by, e.g., a chemical vapor deposition (CVD) or an atomic layer deposition (ALD) process.

The gate electrode 213 may be on the gate insulating layer 120, and may overlap with or overlie the channel region 211c. The gate electrode 213 may be connected to a wire that applies on/off signals to the thin film transistor 100. The gate electrode 213 may include low-resistive metal. For example, the gate electrode 213 may have a single-layered structure or a multi-layered structure including a conductive material such as molybdenum (Mo), aluminum (Al), copper (Cu), and/or titanium (Ti). doped on the source region 211s and the drain region 211d. In gate electrode 213 may have a double-layered structure, e.g., Ti/Cu, Ti/Al, etc., and in this case, a Ti layer is arranged at a lower portion to be smaller than a Cu layer or Al layer in thickness to perform as a barrier.

The organic side wall layer 215 may have an inclined surface with respect to an upper surface of the substrate 110 and may be on a side surface of the gate electrode 213. The organic side wall layer 215 may surround the side surface of the gate electrode 213, and a width of the organic side wall layer 215 may gradually increase from an upper portion to a lower portion of the gate electrode 213 (in a direction towards the substrate 110). A lower effective width W of the organic side wall layer 215 may correspond to the width of the LDD region 211b. Here, 'effective width W' denotes a width of the organic side wall layer 215, by which infiltration of the dopant to the semiconductor layer 211 may be prevented. Alternatively, 'effective width W' may denote a distance from a lower side surface of the gate electrode 213 to a point before or at where the thickness of the organic side wall layer 215 becomes constant. In addition, the 'effective width W' may correspond to the width of the LDD region 211b.

The organic side wall layer 215 may be thin on or near an upper portion of the gate electrode 213 and on an upper portion of the gate insulating layer 120. A thickness t of the organic side wall layer 215 on the upper portions of the gate electrode 213 and the gate insulating layer 120 may be so small that the thickness t does not affect a dopant injection process or a contact hole generating process. In an implementation, the thickness t of the organic side wall layer 215 on or near the upper portion of the gate electrode 213 and/or on the gate insulating layer 120 may be, e.g., equal to or less than 0.05 μm.

For example, in the present embodiment, the organic side wall layer 215 may be relatively thicker around the side surface of the gate electrode 213 or on a region overlapping with the LDD region 211b, and relatively thinner on other regions.

The organic side wall layer 215 may include a silsesquioxane resin or silsesquioxane-based resin.

The silsesquioxane resin may include a polymer, e.g., ladder-like polysilsesquioxane, polyhedral oligomeric silsesquioxane (POSS), etc.

In an implementation, the effective width W or the inclination of the organic side wall layer 215 may be adjusted according to a content of the silsesquioxane resin included in the organic side wall layer 215.

For example, the effective width W of the organic side wall layer 215 may be adjusted according to the content of the (e.g., solid) silsesquioxane resin included in an organic composition for fabricating the organic side wall layer 215.

The organic composition is a material including, e.g., the silsesquioxane resin, an organic solvent, and other additives, and may be coated.

Examples of the organic solvent include aliphatic hydrocarbon solvents such as n-pentane, iso-pentane, hexane, cyclohexane or chloroform, aromatic hydrocarbon solvents such as benzene, toluene, or xylene; alcohol solvents such as methanol, ethanol, n-propanol, iso-propanol, n-butanol, iso-butanol, sec-butanol, or t-butanol, ketone solvents such as methyl ethyl ketone, methyl isobutyl ketone, cyclohexanone, or acetylacetone; ether solvents such as tetrahydrofuran, 2-methyltetrahydrofuran, ethyl ether, n-propyl ether, isopropyl ether, bis(2-methoxyethyl) ether, ethylene glycol methyl ether, or ethylene glycol ethyl ether, ester solvents such as methyl acetate, ethyl acetate, ethylene glycol methyl ether acetate, or propylene glycol methyl ether acetate, or a combination thereof.

The other additives may include, e.g., surfactants, binders, etc.

In an implementation, the organic side wall layer 215 may also include the same material as the dopant injected to the source region 211s and the drain region 211d. In an implementation, the organic side wall layer 215 may include, e.g., the n-type dopant, e.g., P, As, Sb, Bi, etc., or the p-type dopant, e.g., B, Al, In, Ga, etc.

The interlayer insulating layer 130 may cover the gate electrode 213 and the organic side wall layer 215. The interlayer insulating layer 130 may include, e.g., an inorganic material such as silicon oxide, silicon nitride, and/or silicon oxynitride. The interlayer insulating layer 130 may be formed by a chemical vapor deposition (CVD) or an atomic layer deposition (ALD) process.

A source electrode 217s and a drain electrode 215d may be on an upper portion of the interlayer insulating layer 130. The source electrode 217s and the drain electrode 217d may have a single-layered or a multi-layered structure including a conductive material having excellent conductivity, and may be respectively connected to the source region 211s and the drain region 211d of the semiconductor layer 211. The source electrode 217s and the drain electrode 217d may have a single-layered or a multi-layered structure including a conductive material including Al, Cu, and/or Ti. The source electrode 217s and the drain electrode 217d may be connected to the semiconductor layer 211 via a contact hole CNT that penetrates through the interlayer insulating layer 130.

Figure 2:
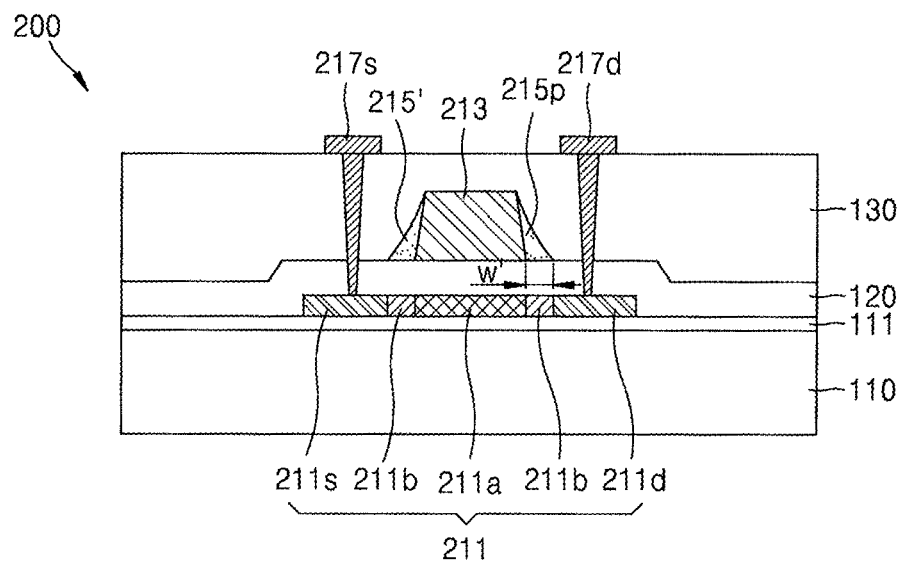
FIG. 2 illustrates a schematic cross-sectional view of a TFT according to another embodiment.

FIG. 2 illustrates a schematic cross-sectional view of a TFT 200 according to another embodiment. In FIG. 2, like reference numerals as those of FIG. 1 denote the same elements, and repeated descriptions thereof may be omitted.

Referring to FIG. 2, the TFT 200 may include, e.g., on the substrate 110, a semiconductor layer 211, the gate insulating layer 120, the gate electrode 213, and an organic side wall layer 215' arranged on a side surface of the gate electrode 213. The TFT 200 may further include, e.g., a buffer layer 111, the interlayer insulating layer 130, the source electrode 217s, and the drain electrode 217d.

In FIG. 2, the organic side wall layer 215' may surround the side surface of the gate electrode 213, and may not be included on an upper portion of the gate electrode 213. A width of the organic side wall layer 215' may gradually increase from an upper portion to a lower portion of the gate electrode 213 (in a direction towards the substrate 110). A lower width W' of the organic side wall layer 215 may correspond to (e.g., may be about equal to) the width of the LDD region 211b.

In an implementation, the organic side wall layer 215' may be on the side surface of the gate electrode 213, e.g., on a region corresponding to or overlying the LDD region 211b.

The organic side wall layer 215' may include, e.g., a silsesquioxane resin.

The silsesquioxane resin may include, e.g., a polymer such as ladder-like polysilsesquioxane, polyhedral oligomeric silsesquioxane (POSS), etc.

In an implementation, the effective width W or the inclination of the organic side wall layer 215' may be adjusted according to a content of the silsesquioxane resin included in the organic side wall layer 215'.

For example, the effective width W of the organic side wall layer 215' may be adjusted according to the content of the (e.g., solid) silsesquioxane resin in an organic composition for fabricating the organic side wall layer 215'.

The organic composition is a material including, e.g., the silsesquioxane resin, an organic solvent, and other additives, and may be coated.

Examples of the organic solvent include aliphatic hydrocarbon solvents such as n-pentane, iso-pentane, hexane, cyclohexane or chloroform, aromatic hydrocarbon solvents such as benzene, toluene, or xylene; alcohol solvents such as methanol, ethanol, n-propanol, iso-propanol, n-butanol, iso-butanol, sec-butanol, or t-butanol, ketone solvents such as methyl ethyl ketone, methyl isobutyl ketone, cyclohexanone, or acetylacetone; ether solvents such as tetrahydrofuran, 2-methyltetrahydrofuran, ethyl ether, n-propyl ether, isopropyl ether, bis(2-methoxyethyl) ether, ethylene glycol methyl ether, or ethylene glycol ethyl ether, ester solvents such as methyl acetate, ethyl acetate, ethylene glycol methyl ether acetate, or propylene glycol methyl ether acetate, or a combination thereof.

The other additives may include, e.g., surfactants, binders, etc.

In an implementation, the organic side wall layer 215' may include the same material as the dopant injected to the source region 211s and the drain region 211d. In an implementation, the organic side wall layer 215' may include, e.g., the n-type dopant, e.g., P, As, Sb, Bi, etc., or the p-type dopant, e.g., B, Al, In, Ga, etc.

The TFTs 100 and 200 according to the embodiments may include the LDD region, and thus, an off-current of the TFTs 100 and 200 may be reduced, and a short channel effect that could otherwise occur when the channel length of the TFTs 100 and 200 is decreased may be prevented.

Also, the TFTs 100 and 200 according to the embodiments may include the organic side wall layers 215 and 215', and the processing steps and processing time may be greatly reduced. A method of manufacturing a thin film transistor according to the embodiment will be described according to the processing order.

FIGS. 3 to 8 illustrate schematic cross-sectional views of stages in a method of manufacturing the TFT 100 according to a processing order, according to an embodiment of the present disclosure.

Figure 3:
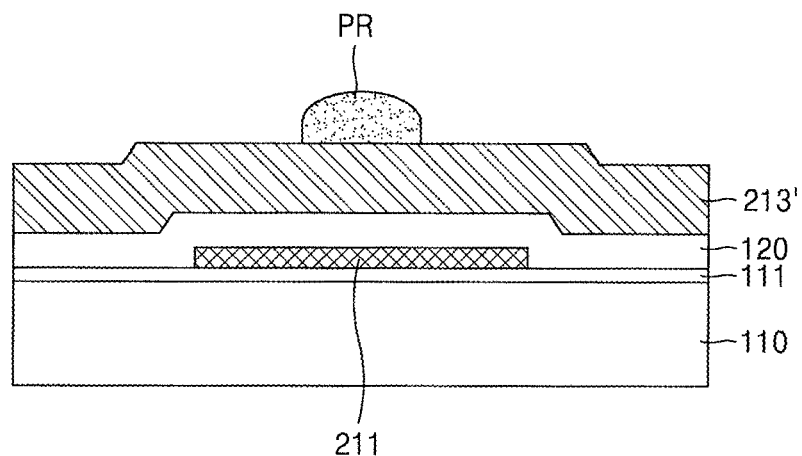
FIGS. 3 to 8 illustrate schematic cross-sectional views of stages in a method of manufacturing a TFT according to a processing order, according to an embodiment of the present disclosure.

Referring to FIG. 3, the buffer layer 111, the semiconductor layer 211, and the gate insulating layer 120 may be formed on the substrate 110.

The buffer layer 111 may include, e.g., an inorganic material such as silicon oxide, silicon nitride, and/or silicon oxynitride, and may be fabricated by a CVD or an ALD process.

The semiconductor layer 211 may include polysilicon by crystallizing amorphous silicon. The crystallization may be performed by a laser annealing using an Excimer laser or YAG laser, or a furnace annealing process. Next, a photoresist pattern may be arranged on a portion where the semiconductor layer 211 is to be provided, and then, may be etched by a wet etching process, a dry etching process, or a combination thereof to form the semiconductor layer 211.

Next, the gate insulating layer 120 covering the semiconductor layer 211 may be formed. The gate insulating layer 120 may include, e.g., an inorganic material such as silicon oxide, silicon nitride, and/or silicon oxynitride, and may be fabricated by a CVD or an ALD process.

A gate electrode material layer 213' may be formed on the gate insulating layer 120. The gate electrode material layer 213' may include, e.g., Mo, Al, Cu, and/or Ti, and may have a single-layered or a multi-layered structure. In an implementation, the gate electrode material layer 213' may be formed by, e.g., a deposition method such as a CVD, a plasma enhanced CVD (PECVD), a lower pressure CVD (LPCVD), a physical vapor deposition (PVD), a sputtering method, an ALD method, etc.

A photoresist pattern PR may be formed on the gate electrode material layer 213'. For example, a location where the photoresist pattern PR is formed may correspond to or overlie a position where the gate electrode 213 is to be formed.

Figure 4:
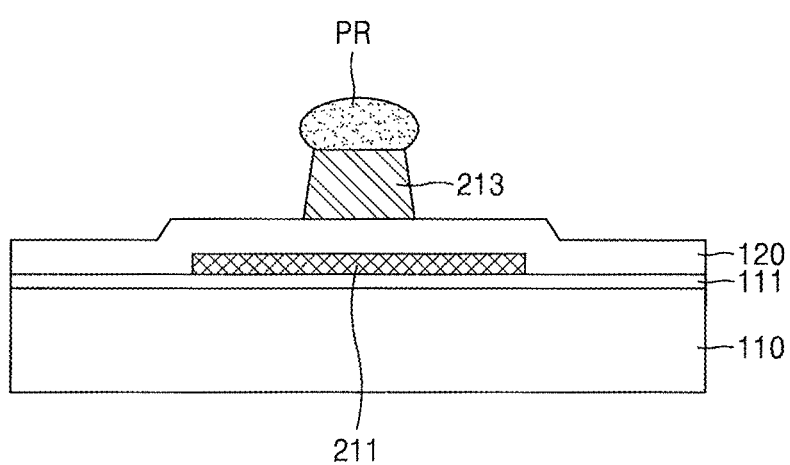

Referring to FIG. 4, the gate electrode material layer 213' may be etched by using the photoresist pattern PR as a mask to form the gate electrode 213. In an implementation, the etching may be, e.g., a wet etching, a dry etching, or a combination thereof.

Figure 5:
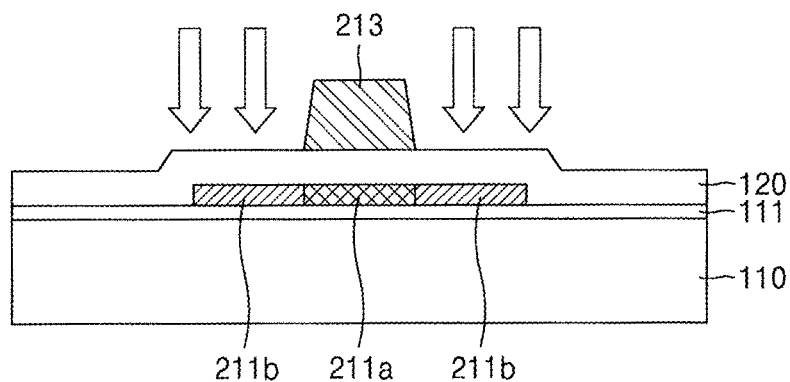

Referring to FIG. 5, the photoresist pattern PR shown in FIG. 4 may be removed, and a first doping process for injecting a low concentration dopant by using the gate electrode 213 as a doping mask may be performed. The dopant may be an n-type dopant or a p-type dopant. The first doping process may be performed to obtain the LDD region 211b, and in the first doping process, the dopant having lower concentration than that of a second doping process that will be described later may be injected. For example, in the first doping process, the dopant having a concentration of about $1 \times 10^{12}$ to about $1 \times 10^{12}$ ions/cm$^3$ may be injected.

Figure 6:
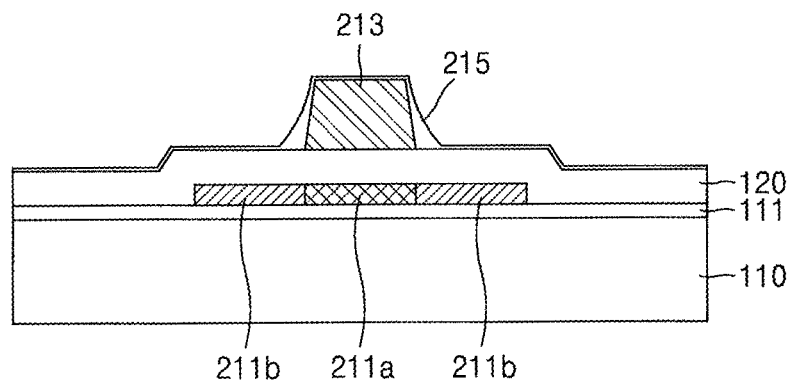

Referring to FIG. 6, the organic side wall layer 215 surrounding the side surface of the gate may be formed.

First, an organic composition in which, e.g., a solid silsesquioxane resin, an organic solvent, and other additives are mixed, may be coated on an entire surface of the substrate 110.

The silsesquioxane resin may include, e.g., a polymer such as ladder-like polysilsesquioxane, polyhedral oligomeric silsesquioxane (POSS), etc.

Examples of the organic solvent include aliphatic hydrocarbon solvents such as n-pentane, iso-pentane, hexane, cyclohexane or chloroform, aromatic hydrocarbon solvents such as benzene, toluene, or xylene; alcohol solvents such as methanol, ethanol, n-propanol, iso-propanol, n-butanol, iso-butanol, sec-butanol, or t-butanol, ketone solvents such as methyl ethyl ketone, methyl isobutyl ketone, cyclohexanone, or acetylacetone; ether solvents such as tetrahydrofuran, 2-methyltetrahydrofuran, ethyl ether, n-propyl ether, isopropyl ether, bis(2-methoxyethyl) ether, ethylene glycol methyl ether, or ethylene glycol ethyl ether, ester solvents such as methyl acetate, ethyl acetate, ethylene glycol methyl ether acetate, or propylene glycol methyl ether acetate, or a combination thereof.

The other additives may include, e.g., surfactants, binders, etc. In an implementation, the organic composition may not include a photosensitive agent.

The organic composition may have a viscosity and/or an adhesive force to a material that may vary depending on a content of the solid silsesquioxane resin. For example, the effective width W and/or inclination of the organic side wall layer 215 may be adjusted according to the content of the silsesquioxane resin included in the organic composition.

In an implementation, the content of the silsesquioxane resin included in the organic composition may be, e.g., adjusted within a range of 1.75 to 5 wt %. In this case, the effective width W of the organic side wall layer 215 may be adjusted to be 1.8 to 5.6 times greater than the thickness or height of the gate electrode 213. Here, the 'effective width W' may denote a distance from a lower side surface of the gate electrode 213 to a point before or where the thickness of the organic composition becomes constant. Data regarding this will be described below with reference to FIGS. 10A to 10C.

Only by coating the organic composition of a liquid type entirely on the substrate 110, the organic composition may be deposited to be thick around the side surface of the gate electrode 213 and to be thin on the other region.

Next, the coated organic composition may be baked to form the organic side wall layer 215. A material status of the organic composition after being baked may be changed, and a weight of the silsesquioxane resin included in the organic side wall layer 215 may be, e.g., about 70 wt % to about 100 wt %.

An organic material that does not include a silsesquioxane resin may provide a flat, e.g., upper, surface through the coating process, and thus, the organic side wall layer 215 according to the present embodiment may not be obtained if the other organic material is used. To provide a shape like the organic side wall layer 215 according to the present embodiment, a method using a photosensitive organic material could be used. However, even if such a photosensitive organic material were to be used, an exposure process and a patterning process would have to be performed, and thus, the processing steps may increase, increasing costs and reducing productivity.

According to the present embodiment, the organic side wall layer 215 may be obtained by performing only coating process and a baking process by using the organic composition including the silsesquioxane resin. Thus, processes may be simplified and the processing time may be greatly reduced.

Figure 7:
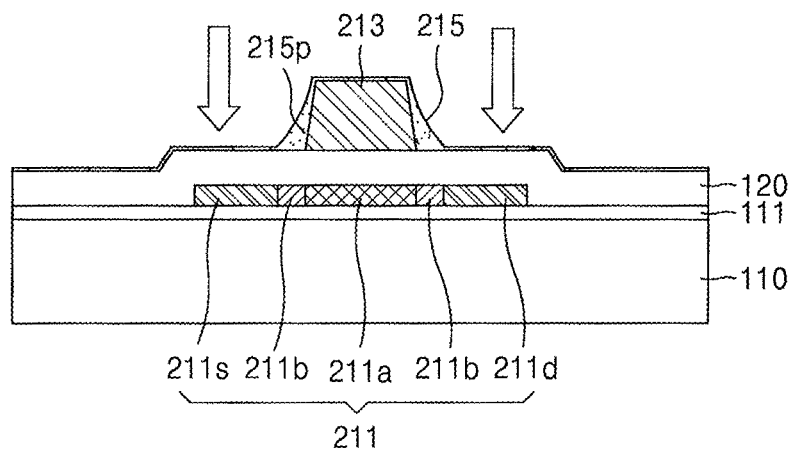

Referring to FIG. 7, a second doping process for forming the source region 211s and the drain region 211d may be performed. In the second doping process, a high concentration dopant may be injected to the semiconductor layer 211 by using the gate electrode 213 and the organic side wall layer 215 as a mask. The dopant may be an n-type dopant or a p-type dopant. A type of the dopant may be the same as the dopant in the first doping process. The second doping process may form the source region 211s and the drain region 211d, and the dopant used in the second doping process may have higher concentration than that of the first doping process. For example, in the second doping process, the dopant having a concentration of about $1 \times 10^{14}$ to about $1 \times 10^{15}$ ions/cm$^3$ may be injected.

In an implementation, the LDD region 211b may be defined to correspond to the effective width W of the organic side wall layer 215 (e.g., the width of the LDD region 211b may be about the same as the effective width W of the organic side wall layer 215), and the source region 211s or the drain region 211d may be at a side of the LDD region 211b.

Through the above processes, the organic side wall layer 215 may include the same material as that of the dopant injected to the source region 21 is and the drain region 211d. For example, the organic side wall layer 215 may include the n-type dopant such as P, As, Sb, Bi, etc., or the p-type dopant such as B, Al, In, Ga, etc.

Figure 8:
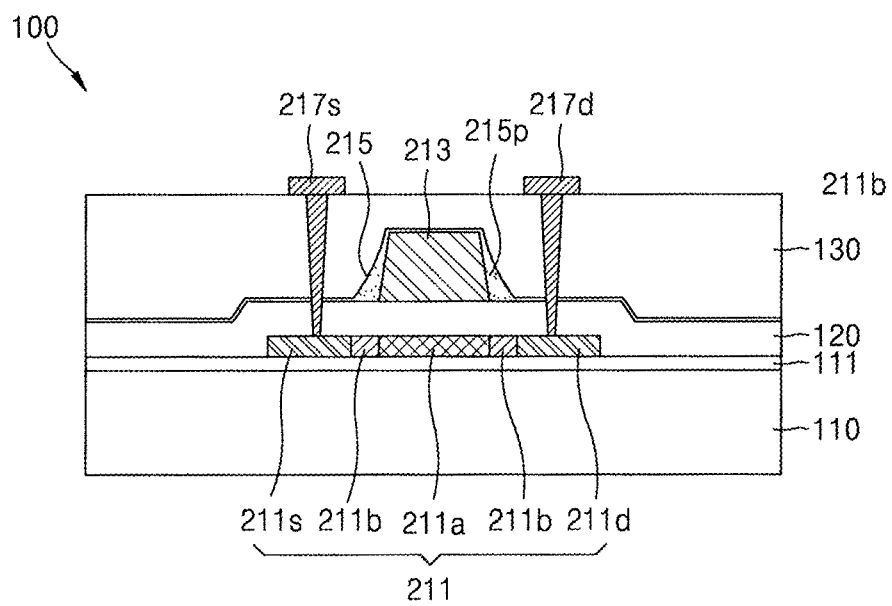

Referring to FIG. 8, the interlayer insulating layer 130 may be formed throughout the entire surface of the substrate 110 on an upper portion of the gate electrode 213. The interlayer insulating layer 130 may include, e.g., an inorganic material such as silicon oxide, silicon nitride, and/or silicon oxynitride, and may be fabricated by a CVD or an ALD process.

Next, a through hole CNT penetrating through the interlayer insulating layer 130 for exposing the source region 211s and the drain region 211d may be generated, and the source electrode 217s and the drain electrode 217d may be formed on the interlayer insulating layer 130.

The source electrode 217s and the drain electrode 217d may include Mo, Al, Cu, and/or Ti, and may have a single-layered or a multi-layered structure. The source electrode 217s and the drain electrode 217d may be obtained by forming a conductive material layer through various deposition methods such as a CVD, a PECVD, an LPCVD, a PVD, a sputtering method, an ALD method, etc., and patterning the conductive material layer.

Figure 9:
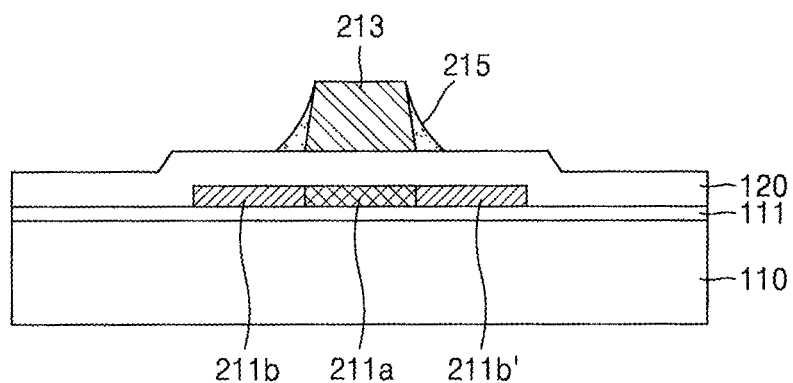
FIG. 9 illustrates a schematic cross-sectional view of a process that may be added to a method of manufacturing a TFT, according to an embodiment of the present disclosure.

FIG. 9 illustrates a schematic cross-sectional view of a process that may be added to a method of manufacturing a thin film transistor according to an embodiment of the present disclosure;

Referring to FIG. 9, after forming the organic side wall layer 215 of FIG. 6, a process of removing the thin part of the organic side wall layer 215 on the gate electrode 213 and the gate insulating layer 120 may be additionally performed.

The above process may be performed by exposing the entire organic side wall layer 215 to an etchant or a developing liquid after forming the organic side wall layer 215.

According to the above processes, the organic side wall layer 215 may remain only on the side surface of the gate electrode 213.

Figure 10A:
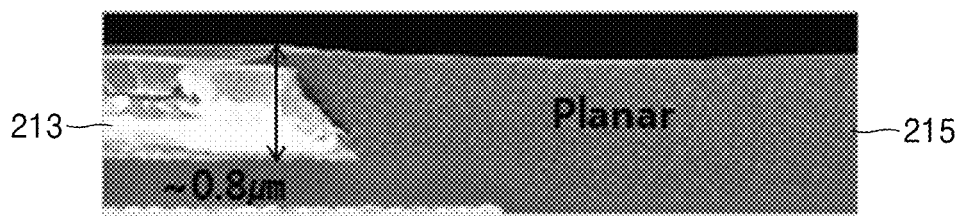
FIGS. 10A to 10C illustrate images of an organic side wall layer according to a content of silsesquioxane resin.
Figure 10B:
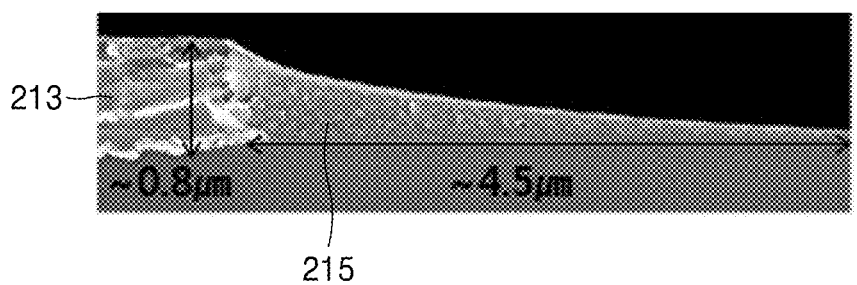
Figure 10C:
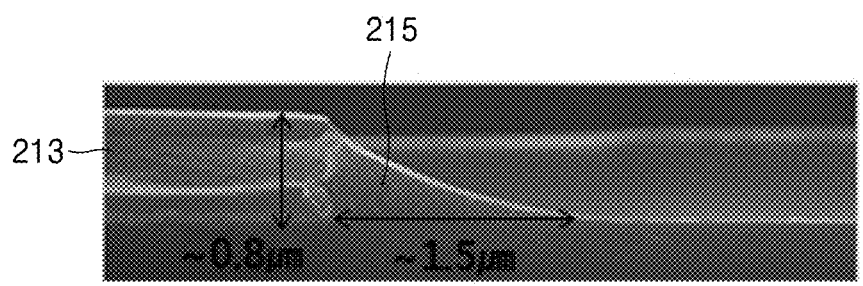

FIGS. 10A to 10C illustrate images of the organic side wall layer 215 according to a content of silsesquioxane resin included in the organic composition (including or at least partially of a liquid phase, e.g., the composition may include a liquid phase and a solid silsesquioxane dispersed or suspended therein). Here, a thickness (e.g., height) of the gate electrode 213 was 0.8 µm.

FIG. 10A shows a case in which the content of the solid silsesquioxane resin was 10 parts by weight (10 wt % or greater) based on 100 parts by weight of the organic composition of the liquid phase. When the silsesquioxane resin is included in an amount of 10 wt % or greater in the organic composition of the liquid phase, as shown in FIG. 10A, the organic composition may be coated to the same height as that of the gate electrode 213 (e.g., may not have the gradual change in width like the embodiments).

FIG. 10B shows a case in which the content of the solid silsesquioxane resin was 5 parts by weight (5 wt %) based on 100 parts by weight of the organic composition of the liquid phase. In this case, the effective width of the organic side wall layer 215 was 4.5 µm, which is about 5.6 times greater than the 0.8 µm thickness (e.g., height) of the gate electrode 213.

FIG. 10C shows a case in which the content of the solid silsesquioxane resin was 1.75 parts by weight (1.75 wt %) based on 100 parts by weight of the organic composition of the liquid phase. In this case, the effective width of the organic side wall layer 215 was 1.5 µm, which is about 1.9 times greater than the 0.8 µm thickness (e.g., height) of the gate electrode 213.

Therefore, when the silsesquioxane resin is included in the organic composition of the liquid phase at 1.75 wt % to 5 wt %, the weight may be meaningful for adjusting the width of the organic side wall layer 215.

The thin film transistors and modifications thereof described above may be applied to a display apparatus, and hereinafter, an example in which the thin film transistor illustrated in FIG. 1 is applied to a display apparatus will be described below.

A display apparatus is an apparatus for displaying images, and examples of the display apparatus may include a liquid crystal display, an electrophoretic display, an organic light emitting display, an inorganic light emitting display, a field emission display apparatus, a surface-conduction electron-emitter display apparatus, a plasma display apparatus, a cathode ray display apparatus, etc.

Hereinafter, an organic light-emitting display apparatus will be described as an example of the display apparatus according to an embodiment of the present disclosure. In an implementation, various other types of display apparatuses may be used.

Figure 11:
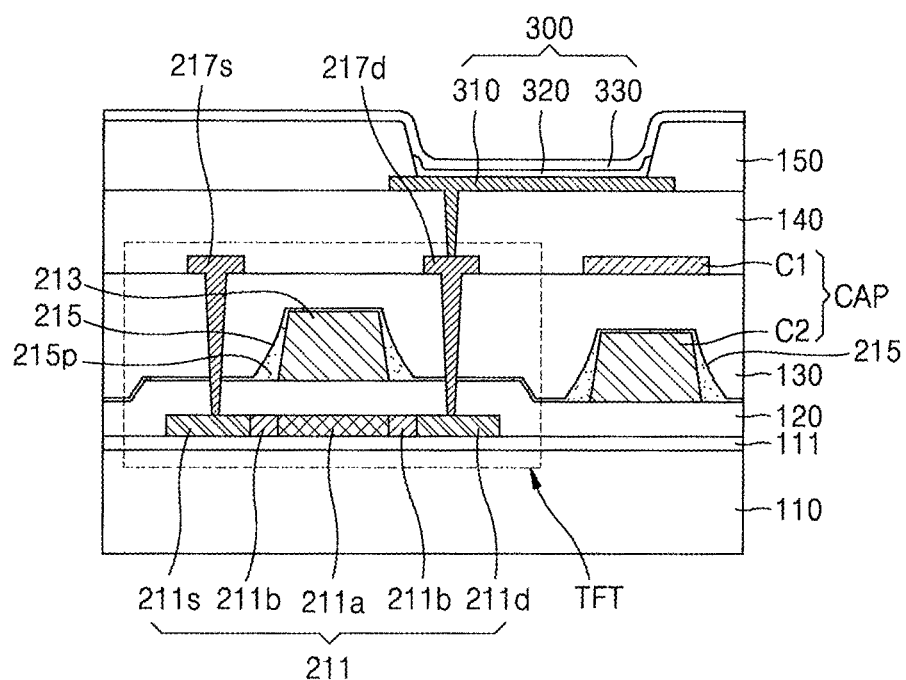
FIG. 11 illustrates a schematic cross-sectional view of a display apparatus including a TFT, according to an embodiment of the present disclosure.

FIG. 11 illustrates a schematic cross-sectional view of a display apparatus including a thin film transistor according to an embodiment of the present disclosure. In FIG. 11, like reference numerals as those of FIG. 1 denote the same elements, and repeated descriptions thereof may be omitted for convenience of description.

Referring to FIG. 11, the display apparatus may further include a display device such as an organic light-emitting device 300 and a capacitor CAP, in addition to the thin film transistor TFT described above.

The capacitor CAP includes a first electrode C1 and a second electrode C2, and an insulating layer may be arranged between the first electrode C1 and the second electrode C2. In some embodiments, the first electrode C1 may include the same material and is arranged at the same layer as the gate electrode 213, and the second electrode C2 may include the same material and is arranged at the same layer as the source electrode 217s and the drain electrode 217d. The interlayer insulating layer 130 may be arranged between the first electrode C1 and the second electrode C2.

In an implementation, as illustrated in FIG. 11, the capacitor CAP may not overlap with the thin film transistor TFT. In an implementation, the capacitor CAP may be arranged on the thin film transistor TFT to overlap with the thin film transistor TFT.

A planarization layer 140 may be arranged on the thin film transistor TFT and/or the capacitor CAP. For example, when the organic light-emitting device 300 is arranged on the thin film transistor TFT as shown in FIG. 8, the planarization layer 140 covers the thin film transistor TFT and planarizes an upper portion of the thin film transistor TFT. The planarization layer 140 may include an organic material such as acryl, benzocyclobutene (BCB), hexamethyldisiloxane (HMDSO), etc. In FIG. 11, the planarization layer 140 has a single-layered structure, but may have various modifications, e.g., a multi-layered structure.

An organic light-emitting device having a pixel electrode 310, an opposite electrode 330, and an intermediate layer 320 arranged between the pixel electrode 310 and the opposite electrode 320 and including an emission layer may be arranged on the planarization layer 140. The pixel electrode 310 is connected to the thin film transistor TFT by contacting one of the source electrode 217s and the drain electrode 217d via an opening in the planarization layer 140 as shown in FIG. 11. In FIG. 11, the pixel electrode 310 is connected to the drain electrode 217d.

The pixel electrode 310 may be a transparent electrode or a reflective electrode. The transparent electrode may include indium tin oxide (ITO), indium zinc oxide (IZO), ZnO, or In2O3, and the reflective electrode may include a reflective layer including Ag, Mg, Al Pt, Pd, Au, Ni, Nd, Ir, Cr, or a compound thereof and a transparent layer including ITO, IZO, ZnO, or In2O3. In some embodiments, the pixel electrode 310 may have a structure of ITO/Ag/ITO.

A pixel-defining layer 150 may be arranged on the planarization layer 140. The pixel-defining layer 150 has an opening corresponding to each sub-pixel, that is, at least an opening exposing a center portion of the pixel electrode 310, to define pixels. Also, in a case illustrated in FIG. 11, the pixel-defining layer 150 increases a distance between an edge of the pixel electrode 310 and the opposite electrode 330 above the pixel electrode 310, in order to prevent generation of an arc at the edge of the pixel electrode 310. The pixel-defining layer 150 may include an organic material such as polyimide, HMDSO, etc.

The intermediate layer 320 of the organic light-emitting device may include a low-molecular or a polymer material. When the intermediate layer 320 includes a low-molecular weight material, the intermediate layer 320 may include a hole injection layer (HIL), a hole transport layer (HTL), an emission layer (EML), an electron transport layer (ETL), and an electron injection layer (EIL) in a single or multiple-layered structure, and examples of organic materials may include copper phthalocyanine (CuPc), N,N-Di(naphthalene-1-yl)-N,N-diphenyl-benzidine (NPB), and tris-8-hydroxyquinoline aluminum (Alq3). The above layers may be formed by a vacuum deposition method.

When the intermediate layer 320 includes a polymer material, the intermediate layer 320 may include an HTL and an EML. Here, the HTL may include PEDOT, and the EML may include a poly-phenylenevinylene (PPV)-based or polyfluorene-based polymer material. The intermediate layer 320 above may be formed by a screen printing method, an inkjet printing method, or a laser induced thermal imaging (LITI) method.

In an implementation, the intermediate layer 320 may include a layer that is integrally formed throughout a plurality of pixel electrodes 310, or a layer that is patterned to correspond to each of the plurality of pixel electrodes 310.

The opposite electrode 330 is arranged facing the pixel electrode 310, as the intermediate layer 320 is interposed therebetween. The opposite electrode 330 may be integrally formed with respect to a plurality of organic light-emitting devices, so as to correspond to a plurality of pixel electrodes 310. That is, the pixel electrode 310 may be patterned in each of pixels, and the opposite electrode 330 may be arranged throughout the entire pixels so as to apply a common voltage to the entire pixels. The opposite electrode 330 may be a transparent electrode or a reflective electrode.

Holes and electrons injected through the pixel electrode 310 and the opposite electrode 330 of the organic light-emitting device 300 combine each other in the emission layer of the intermediate layer 320 to emit light.

The organic light-emitting device 300 may be easily damaged by external moisture or oxygen, and an encapsulation layer or a sealing substrate may cover the organic light-emitting device 300 to protect the organic light-emitting device 300. In an implementation, a polarization layer, a color filter layer, a touch layer, etc. may be further arranged on the encapsulation layer or the sealing substrate.

By way of summation and review, according to demand for high performance and high resolution display apparatuses, reduction of a channel length of a TFT is being considered.

When a length of a channel in a TFT is reduced, a short channel effect could occur. To prevent this, a TFT having a lightly doped drain (LDD) region that is a low concentration area between a channel region and a source (or drain) region has been considered. TFTs having the LDD region may have a long processing time period and complicated manufacturing processes.

As described above, the thin film transistor and the display apparatus according to the embodiments of the present disclosure adopt the organic side wall layer including the silsesquioxane resin, and thus, manufacturing processes may be simplified and the processing time may be greatly reduced.

The thin film transistor according to the embodiment of the present disclosure may reduce the processing steps and time while ensuring excellent performance by using the silsesquioxane organic material.

The embodiments may provide a thin film transistor (TFT) and a method of manufacturing the TFT, capable of reducing manufacturing processes and a processing time period while ensuring excellent performance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor, comprising:
   a substrate;
   a semiconductor layer on the substrate, the semiconductor layer including a channel region, a lightly doped drain (LDD) region, a source region, and a drain region;
   a gate insulating layer covering the semiconductor layer;
   a gate electrode overlapping with the channel region such that the gate insulating layer is interposed between the gate electrode and the channel region; and
   an organic side wall layer on a side surface of the gate electrode,
   wherein the organic side wall layer includes a silsesquioxane resin
   wherein: the source region and the drain region include a dopant, and the organic side wall layer further includes a material that is the same as the dopant included in the source region and the drain region.

2. The thin film transistor as claimed in claim 1, wherein:
   the LDD region is at opposite sides of the channel region, and
   the organic side wall layer overlies the LDD region.

3. The thin film transistor as claimed in claim 1, wherein the organic side wall layer extends to an upper surface of the gate electrode.

4. The thin film transistor as claimed in claim 3, wherein a thickness of a portion of the organic side wall layer at the upper surface of the gate electrode is smaller than a thickness of a portion of the organic side wall layer at the gate insulating layer.

5. A method of manufacturing a thin film transistor, the method comprising:
   forming a semiconductor layer on a substrate;
   forming a gate insulating layer on the substrate to cover the semiconductor layer;
   forming a gate electrode on the gate insulating layer to partially overlap with the semiconductor layer;
   injecting a first dopant into the semiconductor layer by using the gate electrode as a mask;
   forming an organic side wall layer surrounding side surfaces of the gate electrode; and
   injecting a second dopant into the semiconductor layer by using the gate electrode and the organic side wall layer as a mask,
   wherein the organic side wall layer includes a silsesquioxane resin
   wherein an inclination of the organic side wall layer is adjusted according to a content of the silsesquioxane resin.

6. The method as claimed in claim 5, wherein forming the organic side wall includes:
   coating the gate electrode with an organic composition, and
   baking the organic composition.

7. The method as claimed in claim 6, wherein the organic composition of includes the silsesquioxane resin in an amount of 1.7 wt % to 5 wt %, based on a weight of the organic composition.

8. The method as claimed in claim 5, wherein a concentration of the first dopant in the semiconductor layer is lower than a concentration of the second dopant in the semiconductor layer.

9. The method as claimed in claim 5, wherein the first dopant and the second dopant are dopants of a same type.

10. The method as claimed in claim 5, wherein forming the organic side wall layer further includes forming the layer on an upper surface of the gate electrode.

11. The method as claimed in claim 10, further comprising removing the organic side wall layer from the upper surface of the gate electrode.

12. A display apparatus including a thin film transistor, the display apparatus comprising:
a planarization layer covering the thin film transistor;
a pixel electrode on the planarization layer, the pixel electrode being connected to the thin film transistor;
an opposite electrode facing the pixel electrode; and
an intermediate layer between the pixel electrode and the opposite electrode,
wherein the thin film transistor includes:
a semiconductor layer on the substrate, the semiconductor layer including a channel region, a lightly doped drain (LDD) region, a source region, and a drain region;
a gate insulating layer covering the semiconductor layer;
a gate electrode overlapping with the channel region such that the gate insulating layer is interposed between the gate electrode and the channel region; and
an organic side wall layer on a side surface of the gate electrode,
wherein the organic side wall layer includes a silsesquioxane resin
wherein: the source region and the drain region include a dopant, and the organic side wall layer further includes a material that is the same as the dopant included in the source region and the drain region.

13. The display apparatus as claimed in claim 12, wherein:
the LDD region is at opposite sides of the channel region, and
the organic side wall layer overlies the LDD region.

14. The display apparatus as claimed in claim 12, wherein the organic side wall layer extends to an upper surface of the gate electrode.

15. The display apparatus as claimed in claim 14, wherein a thickness of a portion of the organic side wall layer at the upper surface of the gate electrode is smaller than a thickness of a portion of the organic side wall layer at the gate insulating layer.

16. The display apparatus as claimed in claim 12, further comprising a pixel-defining layer exposing a center portion of the pixel electrode and covering an edge of the pixel electrode, the pixel defining layer define pixels.

17. The display apparatus as claimed in claim 12, wherein the intermediate layer includes an emission layer.

* * * * *